(12) United States Patent
Chung et al.

(10) Patent No.: US 7,919,820 B2
(45) Date of Patent: Apr. 5, 2011

(54) CMOS SEMICONDUCTOR DEVICE AND METHOD OF FABRICATING THE SAME

(75) Inventors: Young-su Chung, Suwon-si (KR); Hyung-suk Jung, Suwon-si (KR); Sung Heo, Busan (KR); Hion-suck Baik, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 358 days.

(21) Appl. No.: 12/007,433

(22) Filed: Jan. 10, 2008

(65) Prior Publication Data
US 2008/0203488 A1 Aug. 28, 2008

(30) Foreign Application Priority Data
Feb. 28, 2007 (KR) ........................ 10-2007-0020593

(51) Int. Cl.
*H01L 29/00* (2006.01)
(52) U.S. Cl. ......... 257/369; 257/E21.636; 257/E29.001; 438/199
(58) Field of Classification Search .................. 257/369, 257/E29.001, E21.632, 411, 412, E21.636, 257/E21.637; 438/199, 599
See application file for complete search history.

(56) References Cited

U.S. PATENT DOCUMENTS

| 6,537,901 B2 | 3/2003 | Cha et al. | |
|---|---|---|---|
| 2004/0087091 A1* | 5/2004 | Setton | 438/287 |
| 2004/0180487 A1* | 9/2004 | Eppich et al. | 438/199 |
| 2006/0040439 A1* | 2/2006 | Park et al. | 438/199 |

FOREIGN PATENT DOCUMENTS
KR   10-2004-0003211   1/2004

OTHER PUBLICATIONS

Office Action dated Jul. 21, 2008 from the Korean Patent Office for a counterpart application, KR 10-2007-0020593.
Chinese Office Action dated Oct. 25, 2010 for corresponding Chinese Application No. 200810080578.7 and English translation thereof.

\* cited by examiner

*Primary Examiner* — Thomas L Dickey
*Assistant Examiner* — Fazli Erdem
(74) *Attorney, Agent, or Firm* — Harness, Dickey & Pierce, P.L.C.

(57) ABSTRACT

Example embodiments provide a complementary metal-oxide semiconductor (CMOS) semiconductor device and a method of fabricating the CMOS semiconductor device. The CMOS semiconductor device may include gates in the nMOS and pMOS areas, polycrystalline silicon (poly-Si) capping layers, metal nitride layers underneath the poly-Si capping layers, and a gate insulating layer underneath the gate. The metal nitride layers of the nMOS and pMOS areas may be formed of the same type of material and may have different work functions. Since a metal gate is formed of identical types of metal nitride layers, a process may be simplified, yield may be increased, and a higher-performance CMOS semiconductor device may be obtained.

20 Claims, 7 Drawing Sheets

CMOS SEMICONDUCTOR DEVICE AND METHOD OF FABRICATING THE SAME

FOREIGN PRIORITY STATEMENT

This application claims priority under 35 U.S.C. §119 to Korean Patent Application No. 10-2007-0020593, filed on Feb. 28, 2007, in the Korean Intellectual Property Office, the entire contents of which are incorporated herein by reference.

BACKGROUND

1. Field

Example embodiments are directed to a complementary metal-oxide semiconductor (CMOS) semiconductor device and a method of fabricating the same, and for example, to a dual metal gate CMOS semiconductor device and a method of fabricating the same.

2. Description of the Related Art

To satisfy demand for higher integration and faster operation speeds of CMOS semiconductor devices, gate insulating layers and gate electrodes may be made thin. High-k gate insulating layers having higher dielectric constants than $SiO_2$ may be developed so as to improve upon the physical characteristics and/or manufacturing processes caused by thinning the $SiO_2$ insulating layers. A high-k gate insulating material may be used to thicken an insulating layer to a thickness greater than an effective oxide thickness, and may reduce a leakage current of the insulating layer. It may be difficult to use a high-k material as a gate insulating layer due to a number of considerations, for example compatibility problems with polycrystalline silicon (poly-Si), lack of understanding of a fixed charge, interface control difficulty, lowering of mobility, a higher gate depletion layer, and many others.

In a MOS transistor having a metal inserted poly-Si stack (MIPS) structure as seen in the related art, a depletion layer may not be formed in a gate, and dopant may not penetrate into an insulating layer. It may be difficult to modulate a work function due to implantation of dopant caused by an inserted metal. Thus, in examples of CMOS semiconductor device, gate structures or gate materials having different work functions may be used for nMOS and pMOS transistors.

Related art also discloses a dual metal gate using a metal that may have an n+ function for an nMOS area and a metal that may have a p+ work function for a pMOS area.

Related art also suggests a method of forming a dual metal gate using a method of that may additionally insert a metal layer into an nMOS or pMOS area.

SUMMARY

Example embodiments are directed to a Complementary Metal-Oxide Semiconductor (CMOS) semiconductor device including metal gates formed of homogeneous materials in nMOS and pMOS areas, which may simplify a fabricating process and improve yield. Example embodiments are also directed to a method of fabricating the CMOS semiconductor device.

A CMOS semiconductor device may include nMOS and pMOS areas, including gates in the nMOS and pMOS areas, polycrystalline silicon (poly-Si) capping layers, and metal nitride layers underneath the poly-Si capping layers. A CMOS semiconductor device may also include a gate insulating layer underneath the gate, and the metal nitride layers of the nMOS and pMOS areas may be formed of the same type of material and have different work functions. Differences in the work functions of the metal nitride layers may occur according to differences between dopant densities, for example.

The gate insulating layer may be formed of $HfO_2$, for example, the metal nitride layers may include C, Cl, F, N, O as a dopant and may include N and/or Ti, Ta, W, Mo, Al, Hf, Zr.

The metal nitride layers of the nMOS and pMOS areas may have different thicknesses, and at least one of the metal nitride layers may include a plurality of unit metal nitride layers. The plurality of unit metal nitride layers of the thicker metal nitride layer may include dopants of different densities.

Example embodiments also provide a method of fabricating a CMOS semiconductor device, and may include forming a gate insulating layer on a silicon substrate including nMOS and pMOS areas. A method of fabricating a CMOS semiconductor device may include forming gates on the gate insulating layer. The gates may include metal nitride layers corresponding to the nMOS and pMOS areas and poly-Si capping layers formed on the metal nitride layers. The metal nitride layers of the nMOS and pMOS areas may be formed of the same type of material, and a dopant difference between the metal nitride layers may be adjusted so that the metal nitride layers have different work functions.

An interfacial layer may be formed on the silicon substrate by cleaning the silicon substrate with ozone gas or ozone water, and the thickness of the interfacial layer may be 1.5 nm or less.

Adjustment of the dopant difference between the metal nitride layers may be performed through adjustments of deposition temperatures of the metal nitride layers, for example. The metal nitride layer of the PMOS area may be thicker than the metal nitride layer of the nMOS area, and the work function of the metal nitride layer of the pMOS area may be higher than that of the metal nitride layer of the nMOS area.

The formation of the gate may include forming a first metal nitride layer on the insulating layer, removing a portion corresponding to the nMOS area from the first metal nitride layer, and forming a second metal layer on the first metal layer and the nMOS area. The formation of the gate may also include forming the poly-Si capping layers on the second metal nitride layer, and patterning layers stacked on the insulating layer to form the gates corresponding to the nMOS and PMOS areas on the substrate.

The first and second metal nitride layers may be formed at different process temperatures. The process temperature of the first metal layer may be 100° C. or more, and/or may be lower than the process temperature of the second metal nitride layer. For example, the process temperature of the first metal layer may be about 450° C. and the process temperature of the second metal nitride layer may be about 680° C.

The metal nitride layers may include N and at least one material selected from the group consisting of Ti, W, Ta, Mo, Al, Hf, Zr, and the dopant may include at least one material selected from the group consisting of C, Cl, F, N, and O, for example.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved. A CMOS semiconductor device may include a dual metal gate having a metal inserted polycrystalline silicon (poly-Si) stack (MIPS) structure, and inserting thin metal nitride between a poly-Si layer and an insulating layer may reduce compatibility problems with poly-Si, higher gate depletion, and diffusion of dopant from poly-Si.

Figure 1:
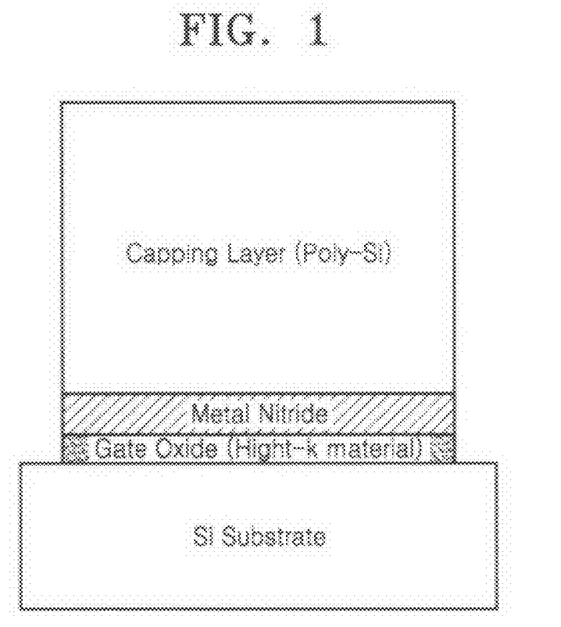
FIG. 1 is a cross-sectional view of a complementary metal-oxide semiconductor (CMOS) semiconductor device having a metal inserted polycrystalline silicon (poly-Si) stack (MIPS) structure in which metal nitride is inserted between a poly-Si layer and a high-k material layer, according to an embodiment of the present invention according to example embodiments.
Figure 2:
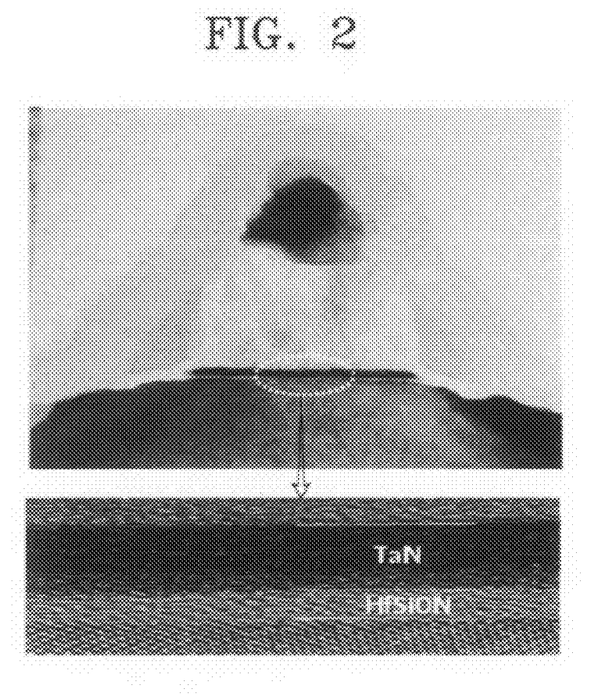
FIG. 2 illustrates a transmission electron microscope (TEM) image of the MIPS structure of FIG. 1 according to example embodiments.

Referring to FIGS. 1 and 2, a TaN layer as a thin metal nitride material may be inserted between a poly-Si layer and gate oxide (GoX) of HfSiON as a high-k material using chemical vapor deposition (CVD) or other like process. Metal nitride including TaN may be more thermally stable than other materials. If such a MIPS structure is used, a gate depletion problem occurring during the use of a stack structure including a high-k material and poly-Si may be reduced.

Figure 3:
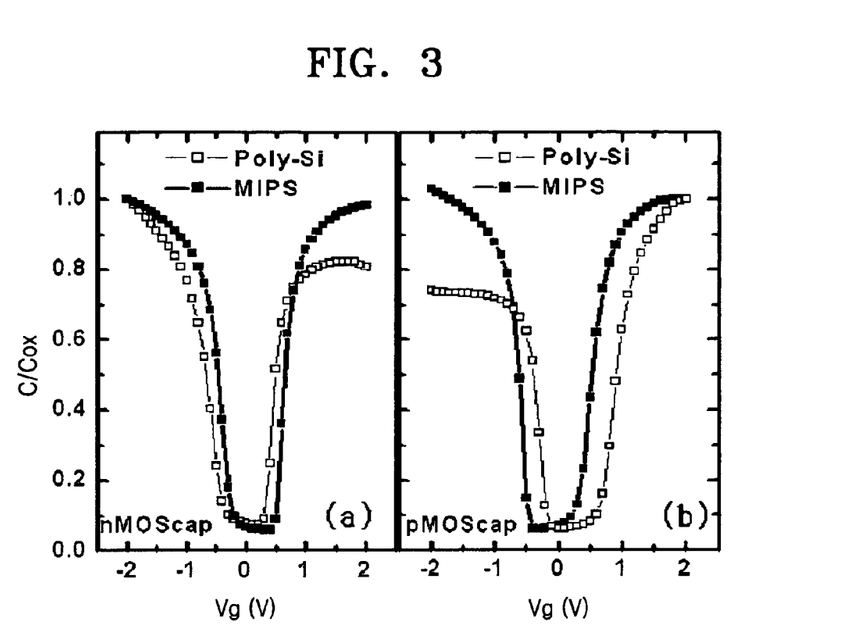
FIG. 3 shows graphs illustrating relationships between a capacity (C) and a voltage (V) in a structure in which metal nitride is inserted between a poly-Si layer and a gate insulating layer and in a structure in which metal nitride is not inserted between a poly-Si layer and a gate insulating layer according to example embodiments.

FIG. 3 shows graphs illustrating relationships between capacities and voltages of a structure in which metal nitride is inserted between a poly-Si layer and a gate insulating layer and a structure in which metal nitride is not inserted between a poly-Si layer and a gate insulating layer. The graph (a) of FIG. 3 illustrates the relationship between the capacity and voltage of an nMOS area, and the graph (b) illustrates the relationship between the capacity and voltage of a pMOS area. As shown in FIG. 3, if a metal nitride layer is inserted between a poly-Si layer and a gate insulating layer, a work function may depend on the metal nitride. Thus, a threshold voltage Vth may shift compared to a single poly-Si structure. A threshold voltage Vth of a gate formed of a single poly-Si layer may be adjusted to a given voltage. If metal nitride is inserted between a poly-Si layer and a gate insulating layer in this example embodiment, the threshold voltage may not be adjusted, since it may be difficult to adjust threshold voltages appropriate for nMOS and pMOS areas of a semiconductor device.

However, if the metal nitride is thin in the MIPS structure, the metal nitride may be affected by a work function of an electrode on the metal nitride.

Figure 4:
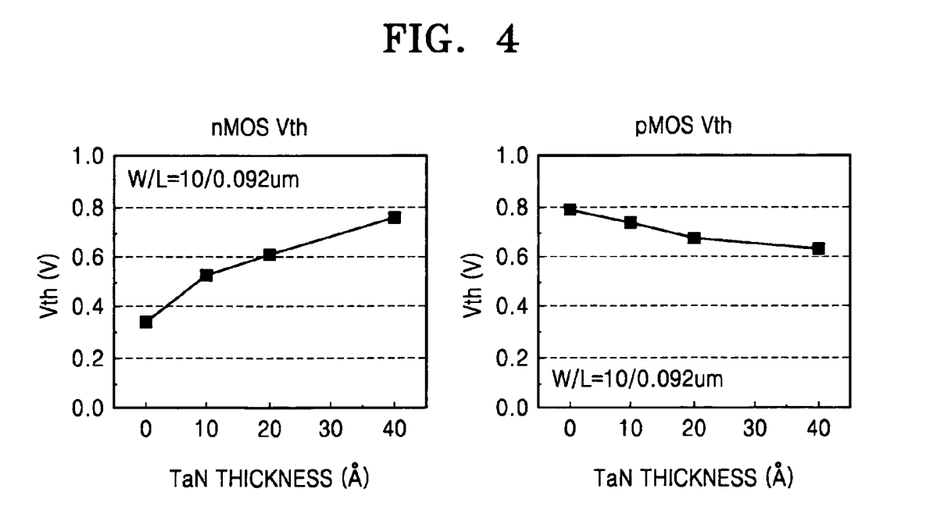
FIG. 4 shows graphs illustrating variations of threshold voltages of nMOS and pMOS areas when a thickness of TaN is increased in a MIPS structure according to example embodiments.

FIG. 4 shows graphs illustrating variations of threshold voltages of nMOS and pMOS areas when a thickness of TaN is increased in an MIPS structure. Referring to FIG. 4, if the thickness of the TaN is changed, the threshold voltages may vary. The threshold voltage of nMOS may increase with an increase of the thickness of the TaN, while the threshold voltage of pMOS may decrease with the increase of the thickness of the TaN.

A thin thickness of TaN may be advantageous to use TaN in an nMOS area. The thickness of TaN may affect a threshold voltage Vth of a pMOS area compared to an nMOS.

Figure 5:
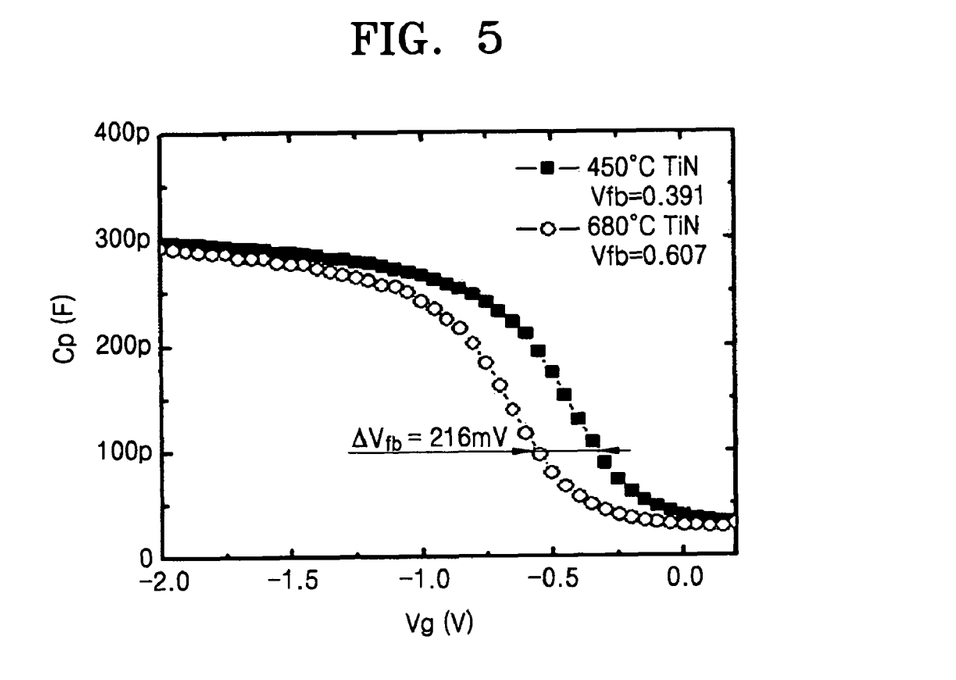
FIG. 5 shows a graph illustrating a relationship between a capacity (C) and a voltage (V) of TiN thin films deposited at two different temperatures according to example embodiments.

FIG. 5 shows a graph illustrating a capacity (C) and voltage (V) of a TiN thin film deposited at different temperatures. TiN was deposited to a thickness of about 50 Å at temperatures of about 450° C. and about 680° C., and FIG. 5 shows a graph illustrating a capacity and a voltage for this example. As shown in FIG. 5, if TiN is deposited at the temperature of about 450° C., a value Vfb may be about −0.391V, and if deposited at the temperature of about 680° C., the value Vfb may be about −0.607. Thus, TiN deposited at a lower temperature, for example about 450° C., may have a higher work function than TiN deposited at a higher temperature, for example about 680° C.

Figure 6:
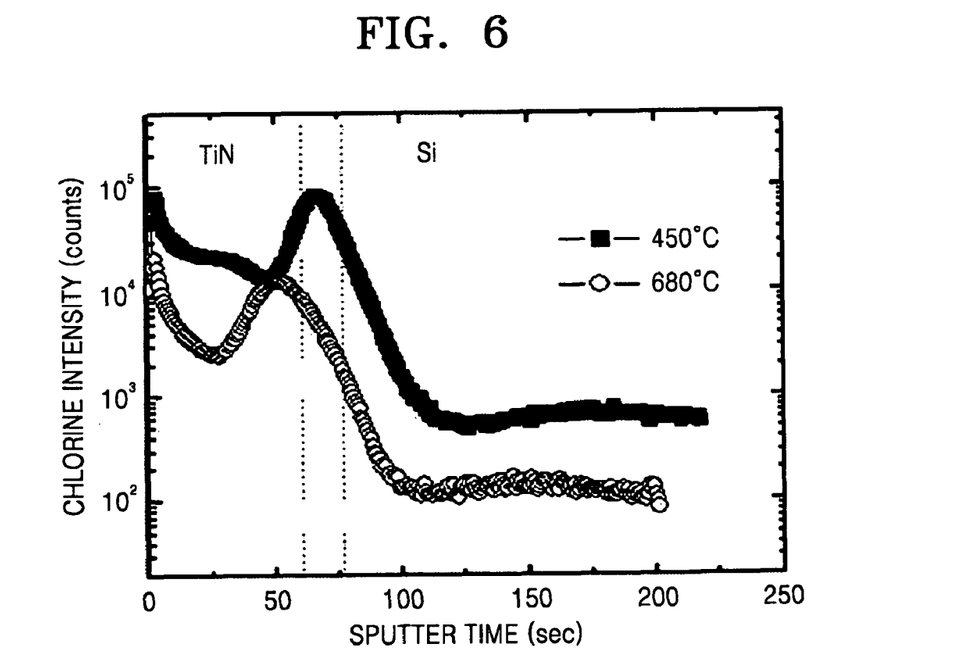
FIG. 6 shows a graph illustrating the amounts of a Cl dopant of TiN, for TiN deposited at a temperature of 680° C. and TiN deposited at a temperature of 450° C. according to example embodiments.

Thus, when the dual metal gate is fabricated using TiN deposited at a high temperature for pMOS, a low threshold voltage Vth may be obtained. A Time-of-Flight Secondary Ion Mass Spectrometry (Tof-SIMS) analysis was performed to analyze a cause of a difference between work functions of TiN thin films deposited at different temperatures. As shown in FIG. 6, TiN deposited at the temperature of about 680° C. may have a smaller content of chlorine (Cl) than TiN deposited at the temperature of about 450° C. A work function may vary with the content of Cl. A work function of TiN deposited at each process temperature may also vary with a variation of the content of C, F, N, O, for example.

Figure 7:
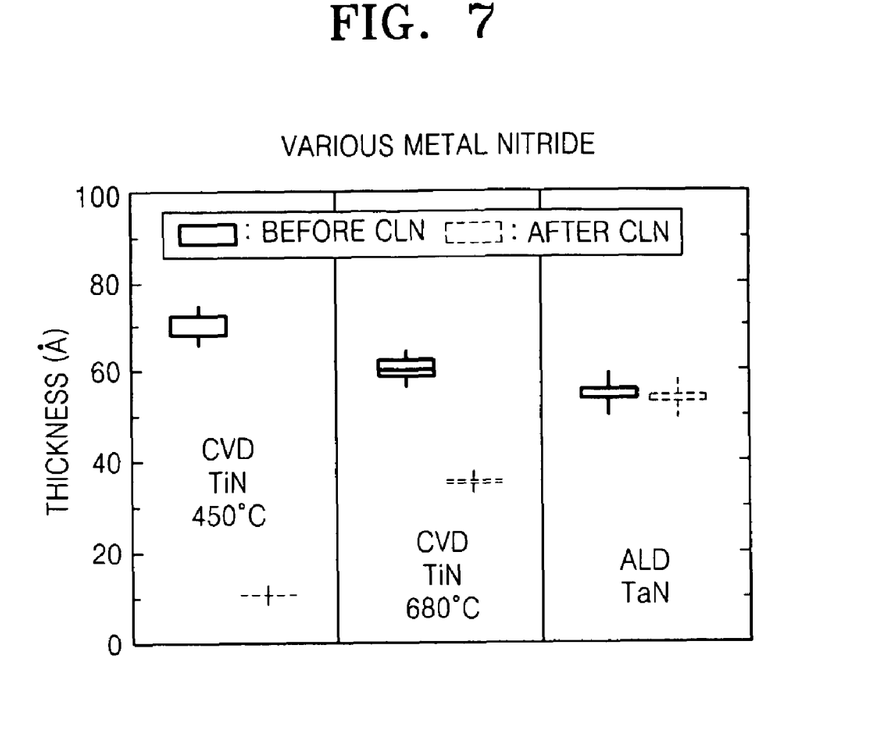
FIG. 7 illustrates results of wet etching performed with respect to various metal nitride layers using an HF solution according to example embodiments.
Figure 8:
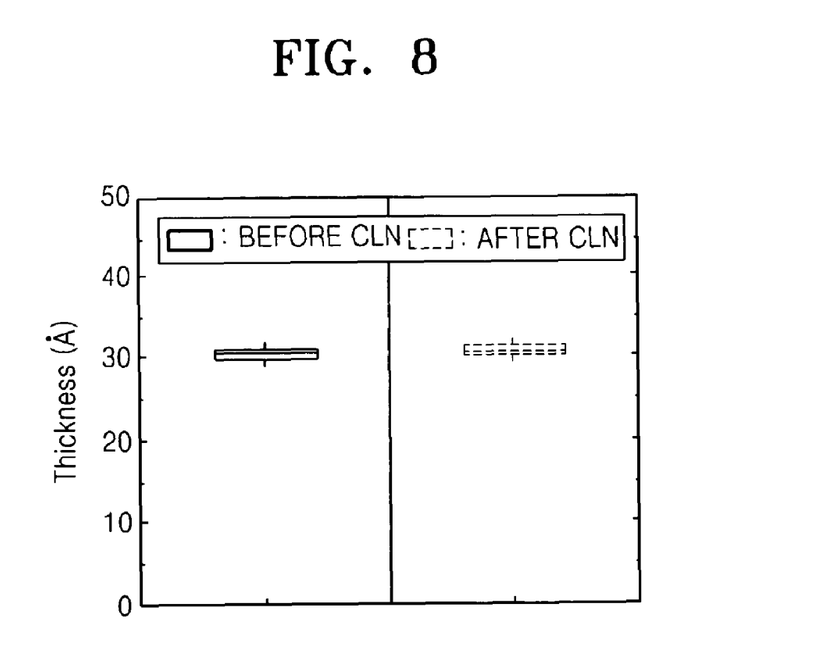
FIG. 8 illustrates the etching selectivities of TaN and annealed $HfO_2$ with respect to an HF solution according to example embodiments.

FIG. 7 illustrates results of wet etching performed with respect to various metal nitride layers using an HF solution, and TiN deposited at a temperature of about 450° C., TiN deposited at a temperature of about 680° C., and TaN deposited at a temperature of about 500° C. are illustrated as examples. Referring to FIG. 7, TiN deposited at a temperature of about 450° C. may have a faster etch rate than TiN deposited at a temperature of about 680° C. TaN and annealed $HfO_2$ were not etched in the HF solution as shown in FIG. 8. When annealed $HfO_2$ and TiN deposited at a temperature of about 450° C. are stacked, and TiN may be removed.

Figure 9A:
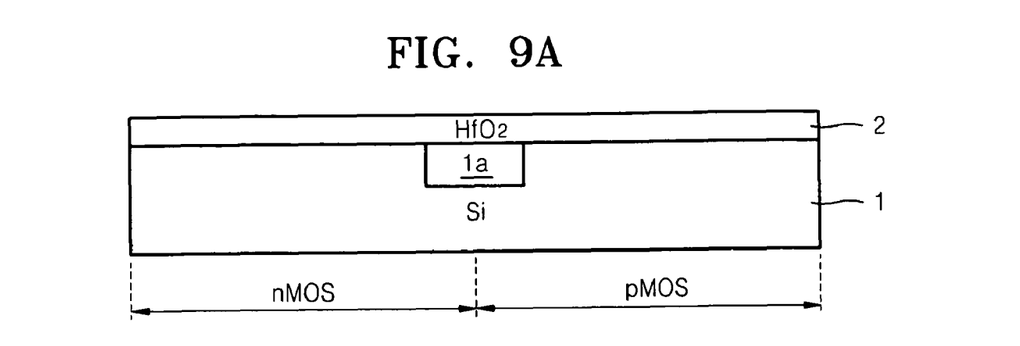
FIGS. 9A through 9G are cross-sectional views illustrating a method of fabricating a CMOS semiconductor device according to example embodiments.
Figure 9B:
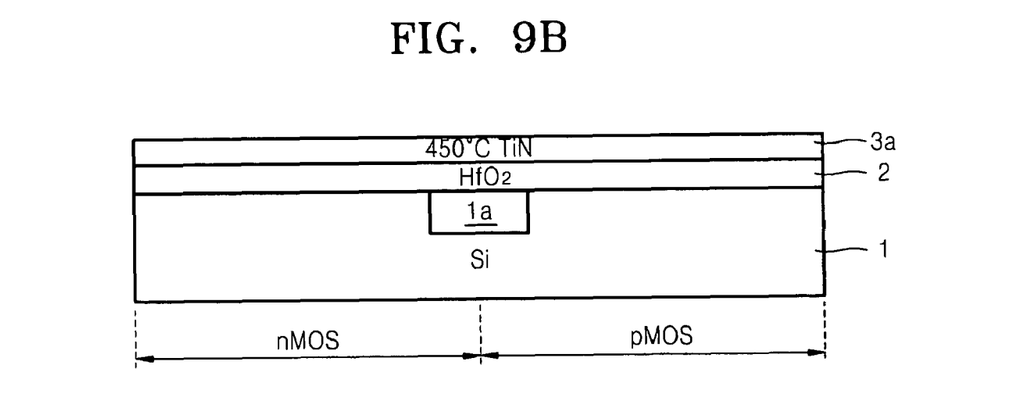
Figure 9C:
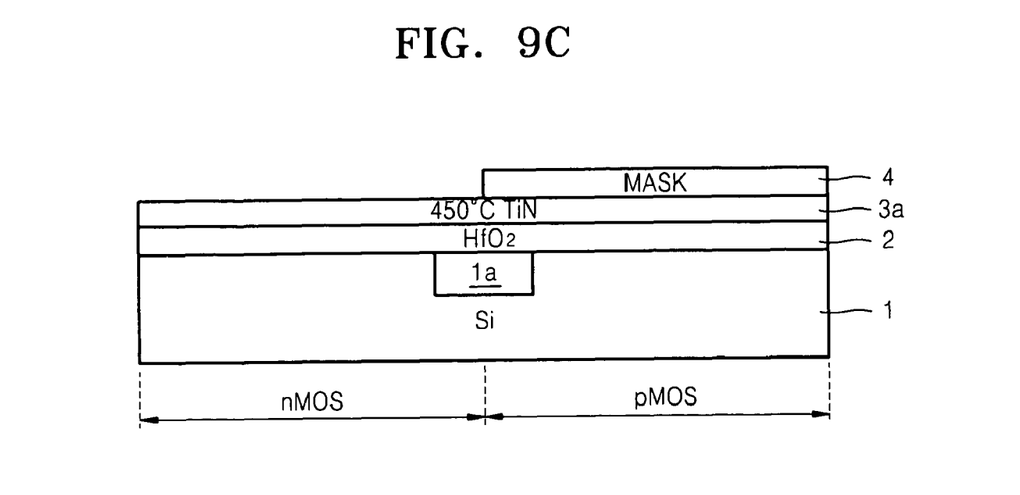
Figure 9D:
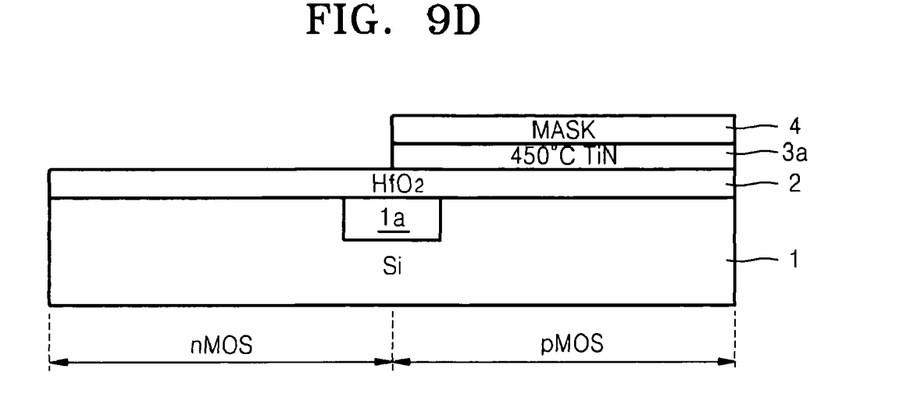
Figure 9E:
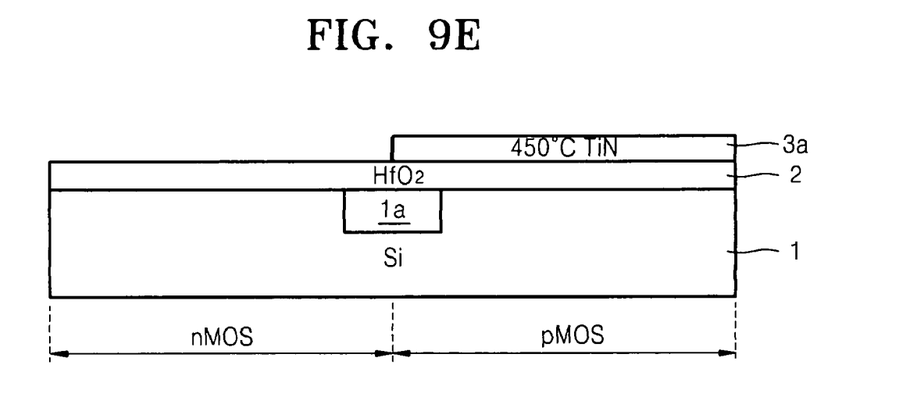
Figure 9F:
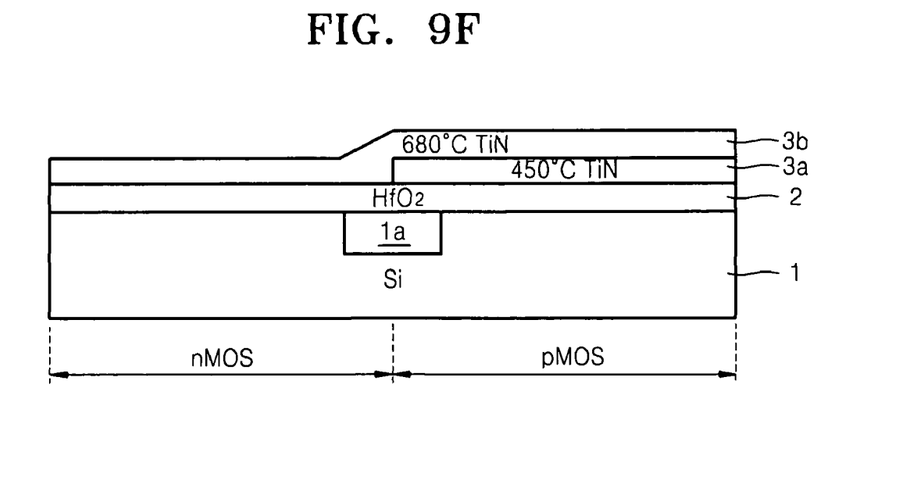
Figure 9G:
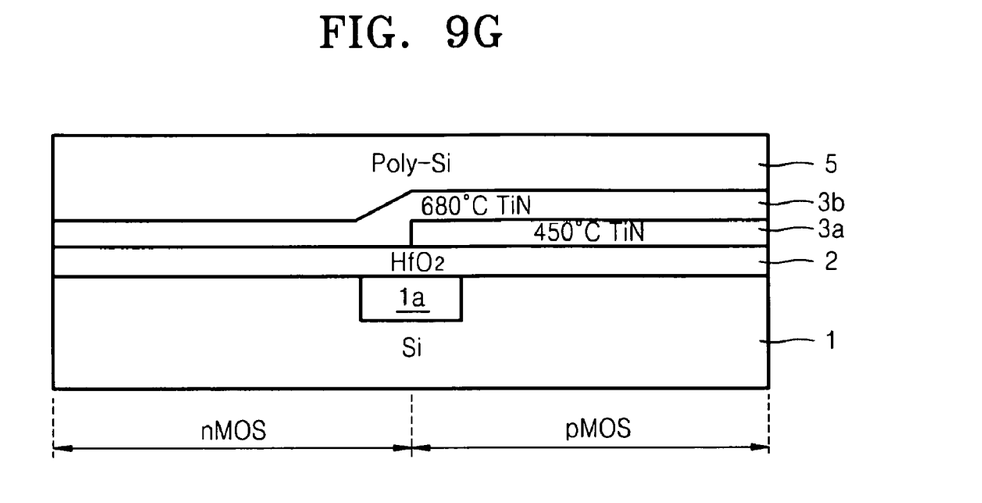
Figure 9H:
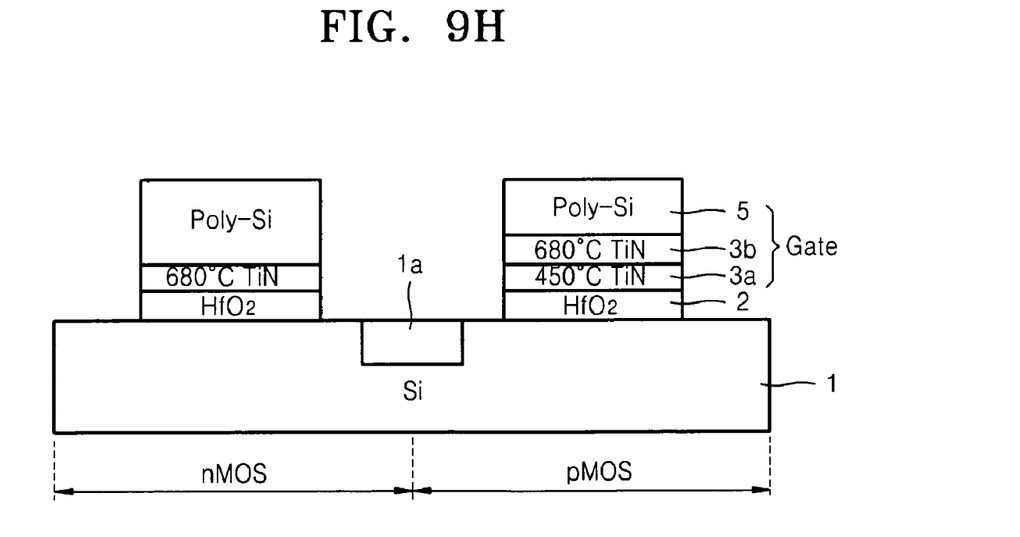
FIG. 9H is a schematic cross-sectional view of a CMOS semiconductor device according to example embodiments.

FIGS. 9A through 9H are cross-sectional views for illustrating a method of fabricating a CMOS semiconductor device according to example embodiments. As shown in FIG. 9H, a CMOS semiconductor device having a dual metal gate with a MIPS structure may be obtained. In the CMOS semiconductor device, Gox, an approximately 680° C. TiN layer and a poly-Si layer may be stacked in an nMOS area, and Gox, an approximately 450° C. TiN layer, an approximately 680° C. TiN layer, and a poly-Si layer may be stacked in a pMOS area.

As shown in FIG. 9A, a silicon substrate 1 may be provided between an insulating layer 1a and the nMOS and PMOS areas. Hf-based oxide as a high-k material may be deposited on the silicon substrate 1 to form a high-k gate insulating layer ($HfO_2$) 2. Before the high-k gate insulating layer 2 is deposited, an interfacial layer 1b may be formed on the silicon substrate 1. The interfacial layer 1b may have a thickness of 1.5 nm or less and may be obtained by cleaning a surface of the silicon substrate 1 using ozone gas or ozone water.

The Hf-based oxide may be deposited using $HfCl_4$ or $H_2O$ reactant, alkyl-amido-based Hf precursor, $H_2O$, $O_3$, or the like using atomic layer deposition (ALD). Alternatively, $HfO_2$ may be deposited as a gate insulating layer using Hf precursor such as Hf-t-Buxoxide, Hf-MMP, or the like, $O_2$, $O_3$, radical oxygen, or the like, using CVD. Additionally, instead of $HfO_2$, HfAlO, HfSiO, or other like material may be deposited as well. After an insulating layer is formed of Hf-based oxide, Post Deposition Annealing (PDA) may be performed for densification. The PDA may be performed at a temperature between about 550° C. and about 1050° C. in an atmosphere including $N_2$, NO, $N_2O$, $O_2$, or $NH_3$, or in an atmosphere including a combination of $N_2$, NO, $N_2O$, $O_2$, and $NH_3$.

As shown in FIG. 9B, a first TiN layer 3a may be deposited in a lower temperature process. The first TiN layer 3a may be deposited to a thickness between 1 Å and 200 Å, for example, and may be deposited at a lower temperature than a deposition temperature of a second TiN layer 3b, for example 450° C. $TiCl_4$ and $NH_3$ may be used as precursors, and ALC and CVD may be used as a deposition method.

As shown in FIG. 9C, a specific area, such as a photoresist (PR) mask 4 opening the nMOS area, may be formed on the first TiN layer 3a of the pMOS area.

As shown in FIG. 9D, an opened portion of the first TiN layer 3a of the nMOS area, which is not covered with the PR mask 4, may be removed. The PR mask 4 may be used a pattern during the removal of the first TiN 3a layer. Wet or dry etching, or other like method, may be used as a removing method. However, wet etching may be used to prevent damage to plasma.

As shown in FIG. 9E, the PR mask 4 may be removed. The removal of the PR mask 4 may be performed using ashing and strip processes. The ashing process may be $O_2$ ashing, $N_2$ ashing, or $N_2$ ashing additionally including a material containing fluorine and hydrogen, for example. A CVD-TiN removing method using a hard mask may be used to pattern the first TiN layer 3a. If the hard mask is used, $SiO_2$, SiN, poly-Si, or other like material may be used, and a wet chemical having high selectivity with a TiN material may be used.

As shown in FIG. 9F, the first TiN layer 3a may be removed from the nMOS area, and then the second TiN layer 3b may be deposited to a thickness between 1 Å and 200 Å at a higher process temperature than the process temperature of the first TiN layer 3a, such as a process temperature of 680° C., for example. A difference between the process temperatures of the first and second TiN 3a and 3b may be within a range of about 50° C. and about 300° C., for example.

As shown in FIG. 9G, poly-Si may be deposited on the second TiN layer 3b to form a capping layer 5. As shown in FIG. 9H, a CMOS semiconductor device may be obtained using a CMOS process. A difference between the thicknesses of the first TiN 3a and second TiN layer 3b may be 10 Å or more, for example.

In the above example embodiment, process temperatures of the first TiN layer 3a and the second TiN layer 3b may be set to adjust an amount of impurity such as Cl with respect to TiN, which may adjust a work function. Thus, according to additional example embodiments, any layer forming method that is performed under conditions for differentiating contents of impurities of the first TiN layer 3a and the second TiN layer 3b, besides conditions for differentiating process temperatures, may be used.

Example embodiments of a CMOS semiconductor device may include nMOS and pMOS areas. A capping layer may be formed of poly-Si in the nMOS and pMOS areas. A metal nitride layer may be formed between gate insulating layers in the nMOS and pMOS areas. The metal nitride layer in an area, such as in the pMOS area provided in example embodiments, may include two stacks having different impurity densities. A dual metal gate having a desired work function may be obtained using metal nitride layers having different densities of impurities, such as Cl for example.

Example embodiments provide that one TiN layer may be formed in the nMOS area, and two TiN layers may be formed in the pMOS area. According to other example embodiments, a plurality of TiN layers may be formed in either of the nMOS and PMOS areas, and the number of TiN layers may vary.

While a TiN layer has been described in the above example embodiments, a nitride layer formed of Ti, Ta, W, Mo, Al, Hf, and/or Zr may be used, and work functions of the nMOS and PMOS areas may vary.

The CMOS semiconductor device may include the nMOS and pMOS areas as shown in FIG. 8H. A poly-Si capping layer and a gate including metal nitride layers formed on the poly-Si capping layer may be provided. A gate insulating layer may be formed of a high-k material such as $Hf_2O$ underneath the gate in the nMOS and PMOS areas. The metal nitride layers in the nMOS and pMOS areas have different contents of impurities which may include at least one of C, Cl, F, N, and/or O. Also, the metal nitride layer may include Ti, Ta, W, Mo, Al, Hf, and/or Zr. The metal nitride layers in the nMOS and pMOS areas may have different thicknesses, and the metal nitride layer having a thicker thickness may have a multilayer structure, and for example may have two unit stacks which include impurities having different contents.

As example embodiments provide, metal gates formed of the same types of materials may be used in nMOS and PMOS areas. Thus, a reaction between heterogeneous materials in gates formed of heterogeneous materials may not occur, and deterioration in performance of a CMOS semiconductor device may be reduced. Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A Complementary Metal-Oxide Semiconductor (CMOS) semiconductor device including nMOS and pMOS areas, comprising:
   gates in the nMOS and pMOS areas and including polycrystalline silicon (poly-Si) capping layers and metal nitride layers underneath the poly-Si capping layers; and
   a gate insulating layer underneath at least one of the gates,
   wherein the metal nitride layers of the nMOS and pMOS areas are of the same type of material,
   a thickness of the metal nitride layer of the nMOS area is less than a thickness of the metal nitride layer of the pMOS area, and
   a work function of the metal nitride layer of the nMOS area is less than a work function of the metal nitride layer of the pMOS area.

2. The CMOS semiconductor device of claim 1, wherein the gate insulating layer includes $HfO_2$.

3. The CMOS semiconductor device of claim 2, wherein the metal nitride layers include a dopant including at least one of C, Cl, F, N, and O.

4. The CMOS semiconductor device of claim 1, wherein the metal nitride layers include a dopant including at least one of C, Cl, F, N, and O.

5. The CMOS semiconductor device of claim 1, wherein the metal nitride layers include N and at least one of Ti, Ta, W, Mo, Al, Hf, and Zr.

6. The CMOS semiconductor device of claim 5, wherein the metal nitride layers include TiN.

7. The CMOS semiconductor device of claim 5, wherein one of the metal nitride layers includes a plurality of unit metal nitride layers.

8. The CMOS semiconductor device of claim 1, wherein one of the metal nitride layers includes a plurality of unit metal nitride layers.

9. The CMOS semiconductor device of claim 8, wherein the metal nitride layer of the pMOS area includes the plurality of unit metal nitride layers, and
   the plurality of unit metal nitride layers of the metal nitride layer of the pMOS area include dopants of different densities.

10. The CMOS semiconductor device of claim 7, wherein the metal nitride layer of the pMOS area includes the plurality of unit metal nitride layers, and
    the plurality of unit metal nitride layers of the metal nitride layer of the pMOS area include dopants of different densities.

11. A method of fabricating a CMOS semiconductor device, comprising:
    forming a gate insulating layer on a silicon substrate including nMOS and pMOS areas; and
    forming gates on the gate insulating layer, the gates including metal nitride layers corresponding to the nMOS and pMOS areas and poly-Si capping layers formed on the metal nitride layers,
    wherein the metal nitride layers of the nMOS and pMOS areas are formed of the same type of material,
    the metal nitride layer of the pMOS area is thicker than the metal nitride layer of the nMOS area, and
    a work function of the metal nitride layer of the pMOS area is greater than a work function of the metal nitride layer of the nMOS area.

12. The method of claim 11, wherein the forming of the gates includes:
    forming a first metal nitride layer on the gate insulating layer;
    removing a portion corresponding to the nMOS area from the first metal nitride layer;
    forming a second metal nitride layer on the first metal nitride layer and the nMOS area;
    forming the poly-Si capping layers on the second metal nitride layer; and
    patterning layers stacked on the insulating layer to form the gates corresponding to the nMOS and pMOS areas on the substrate.

13. The method of claim 12, wherein the first and second metal nitride layers are formed at different process temperatures.

14. The method of claim 13, wherein the process temperature of the first metal nitride layer is about 100° C. or more lower than the process temperature of the second metal nitride layer.

15. The method of claim 14, wherein the process temperature of the first metal nitride layer is about 450° C. and the process temperature of the second metal nitride layer is about 680° C.

16. The method of claim 11, wherein the metal nitride layers include N and at least one selected from the group consisting of Ti, W, Ta, Mo, Al, Hf, and Zr.

17. The method of claim 16, wherein a dopant of at least one of the metal nitride layers includes at least one of C, Cl, F, N, and O.

18. The method of claim 11, wherein a dopant of at least one of the metal nitride layers includes at least one of C, Cl, F, N, and O.

19. The method of claim 11, wherein an interfacial layer is formed on the silicon substrate by cleaning the silicon substrate with ozone gas or ozone water.

20. The method of claim 19, wherein the interfacial layer has a thickness of about 1.5 nm or less.

* * * * *